US009448480B2

(12) United States Patent
Nishita et al.

(10) Patent No.: US 9,448,480 B2
(45) Date of Patent: Sep. 20, 2016

(54) RESIST UNDERLAYER FILM FORMATION COMPOSITION AND METHOD FOR FORMING RESIST PATTERN USING THE SAME

(71) Applicant: NISSAN CHEMICAL INDUSTRIES, LTD., Tokyo (JP)

(72) Inventors: Tokio Nishita, Toyama (JP); Ryuji Ohnishi, Toyama (JP); Noriaki Fujitani, Toyama (JP); Rikimaru Sakamoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 15/023,823

(22) PCT Filed: Sep. 22, 2014

(86) PCT No.: PCT/JP2014/075095
§ 371 (c)(1),
(2) Date: Mar. 22, 2016

(87) PCT Pub. No.: WO2015/046149
PCT Pub. Date: Apr. 2, 2015

(65) Prior Publication Data
US 2016/0238936 A1 Aug. 18, 2016

(30) Foreign Application Priority Data

Sep. 27, 2013 (JP) .................................. 2013-201830

(51) Int. Cl.
| | |
|---|---|
| G03F 7/11 | (2006.01) |
| C08G 59/42 | (2006.01) |
| G03F 7/20 | (2006.01) |
| G03F 7/16 | (2006.01) |
| G03F 7/32 | (2006.01) |
| C09D 167/00 | (2006.01) |
| H01L 21/027 | (2006.01) |

(52) U.S. Cl.
CPC ............... *G03F 7/11* (2013.01); *C09D 167/00* (2013.01); *G03F 7/168* (2013.01); *G03F 7/2004* (2013.01); *G03F 7/2053* (2013.01); *G03F 7/2059* (2013.01); *G03F 7/32* (2013.01); *H01L 21/0276* (2013.01)

(58) Field of Classification Search
None
See application file for complete search history.

(56) References Cited

U.S. PATENT DOCUMENTS

| 5,296,542 A | * | 3/1994 | Layton | ................. C08G 63/605 |
|---|---|---|---|---|
| | | | | 524/600 |
| 2010/0092894 A1 | * | 4/2010 | Liu | ......................... G03F 7/091 |
| | | | | 430/325 |

FOREIGN PATENT DOCUMENTS

| JP | 2010-181453 A | 8/2010 |
|---|---|---|
| WO | 2005/098542 A1 | 10/2005 |
| WO | 2009/096340 A1 | 8/2009 |
| WO | 2009/104685 A1 | 8/2009 |
| WO | 2010/061774 A1 | 6/2010 |
| WO | 2012/124597 A1 | 9/2012 |
| WO | 2013/141015 A1 | 9/2013 |

OTHER PUBLICATIONS

English translation of JP, 2010-181453 A (2010) from machine translation from AIPN Japan Patent Office National Center for Industrial Property Information and Training, generated Jun. 24, 2016, 13 pages.*
Oct. 28, 2014 Written Opinion of the International Searching Authority issued in International Application No. PCT/JP2014/075095.
Oct. 28, 2014 International Search Report issued in International Patent Application No. PCT/JP2014/075095.

* cited by examiner

*Primary Examiner* — Cynthia Hamilton
(74) *Attorney, Agent, or Firm* — Oliff PLC

(57) ABSTRACT

The present invention provides a novel resist underlayer film formation composition for lithography. A resist underlayer film formation composition for lithography comprising: a polymer having a structure of Formula (1) at a terminal of a polymer chain; a cross-linking agent; a compound promoting a cross-linking reaction; and an organic solvent;

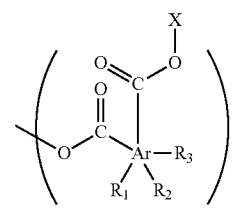

(1)

(where $R_1$, $R_2$, and $R_3$ are each independently a hydrogen atom, a linear or branched $C_{1-13}$ alkyl group, a halogeno group, or a hydroxy group; at least one of $R_1$, $R_2$, and $R_3$ is the alkyl group; Ar is a benzene ring, a naphthalene ring, or an anthracene ring; two carbonyl groups are bonded to respective two adjacent carbon atoms of Ar; and X is a linear or branched $C_{1-6}$ alkyl group optionally having a $C_{1-3}$ alkoxy group as a substituent).

10 Claims, 1 Drawing Sheet

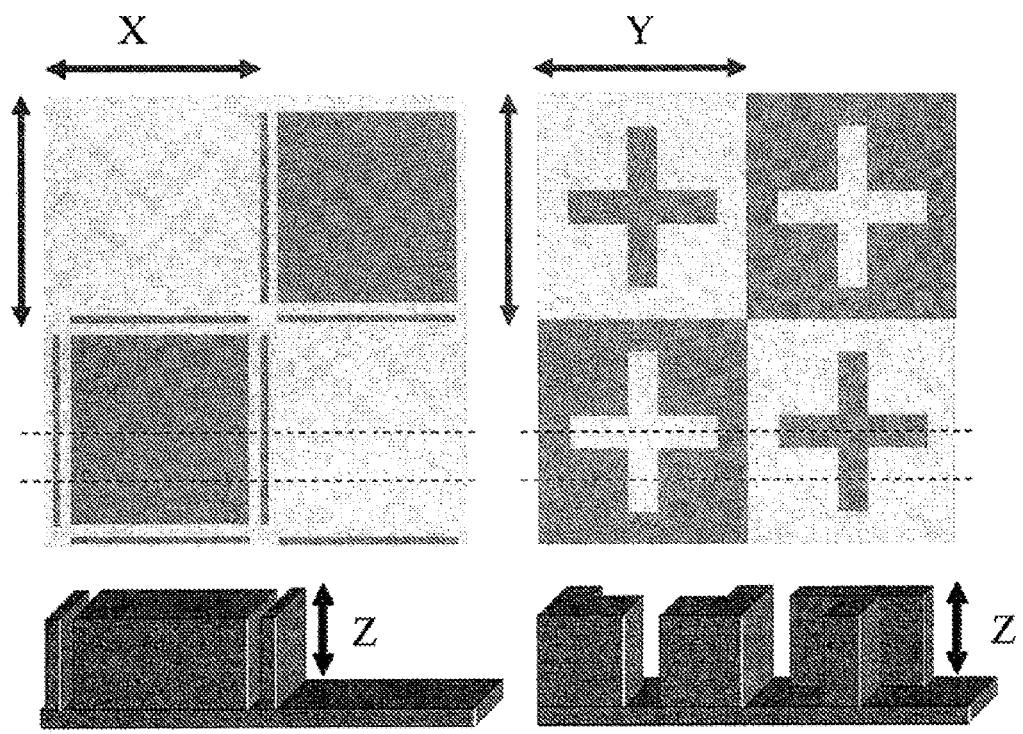
X=13 μm, Y=14 μm, Z=230nm

RESIST UNDERLAYER FILM FORMATION COMPOSITION AND METHOD FOR FORMING RESIST PATTERN USING THE SAME

TECHNICAL FIELD

The present invention relates to a resist underlayer film formation composition for lithography, containing a solid content having excellent solubility in organic solvents and has excellent coating properties on a substrate even when a resist underlayer film having a thin film thickness (20 nm or less, for example) is formed and to a method for forming a resist pattern using the resist underlayer film formation composition.

BACKGROUND ART

Conventionally, in the production of semiconductor devices, microfabrication has been carried out by lithography using a resist composition. The microfabrication is a machining process in which a thin film of a photoresist composition is formed on a semiconductor substrate such as a silicon wafer, active rays such as ultraviolet rays are radiated onto the film for development through a mask pattern in which a pattern of a device is depicted, and the substrate is etched using the obtained photoresist pattern as a protective film to form a tine concave-convex corresponding to the pattern on the surface of the substrate. In recent years, semiconductor devices have been further integrated, and active rays to be used have changed from an i-line (365 nm wavelength) and a KrF excimer laser (248 nm wavelength) to an ArF excimer laser (193 nm wavelength) having a shorter wavelength. Such a change raises large issues of influence of irregular reflection of active rays from a semiconductor substrate and standing wave. To address the issues, a method for providing an anti-reflective coating (Bottom Anti-Reflective Coating, BARC) between a resist and a semiconductor substrate has been widely studied. The anti-reflective coating is also called a resist underlayer film. For such anti-reflective coatings, many studies of organic anti-reflective coatings formed of a polymer or the like having a light absorbing moiety have been carried out because of the easy availability and the like.

Patent Documents 1 to 3 disclose resist underlayer films (anti-reflective coatings) that cause no intermixing with photoresist films formed on the top layer and with which desired optical parameters (k value and n value) can be obtained when the resist underlayer films are exposed to an ArF excimer laser, and also a desired dry etching rate can be obtained.

On the other hand, in lithography employing EUV (abbreviation of extreme ultraviolet rays, 13.5 nm in wavelength) exposure, which is a further microfabrication technique, although no reflection occurs on the substrate, finer patterning causes an issue of roughness on the side wall of a resist pattern. For this reason, many studies have been performed regarding a resist underlayer film for forming a resist pattern close to a precise rectangular shape. A composition for forming a resist underlayer film with reduced outgassing is disclosed as a material for forming a resist underlayer film for high-energy radiation of EUV, X-rays, electron beams, and the like (Patent Document 4).

PRIOR ART DOCUMENTS

Patent Documents

Patent Document 1: WO 2005/098542
Patent Document 2: WO 2009/096340
Patent Document 3: WO 2009/104685
Patent Document 4: WO 2010/061774

SUMMARY OF THE INVENTION

Problem to be Solved by the Invention

Examples of properties required for the resist underlayer film include causing no intermixing with a resist film to be formed on the top layer (insoluble in a resist solvent) and a larger dry etching rate than that of the resist film.

In lithography employing EUV exposure, the width of a pattern line to be formed is 32 nm or less, and a resist underlayer film for EUV exposure is formed to be used so as to have a smaller film thickness than that of a conventional film. Pinholes, aggregations, and other defects likely occur in the formation of such a thin film due to the influence of the surface of a substrate, a polymer to be used, or the like, and thus, it is difficult to form a defect-free uniform film.

It is an object of the present invention to provide a composition for forming a resist underlayer film, with which a desired resist pattern can be formed by solving the issues described above.

Means for Solving the Problem

The present invention provides, according to a first aspect, a resist underlayer film formation composition for lithography comprising a polymer having a structure of Formula (1) at a terminal of a polymer chain, a cross-linking agent, a compound promoting a cross-linking reaction, and an organic solvent:

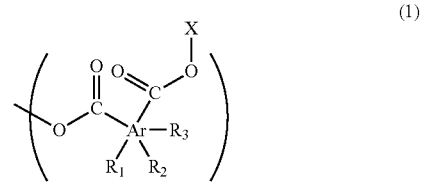

(where $R_1$, $R_2$, and $R_3$ are each independently a hydrogen atom, a linear or branched $C_{1-13}$ alkyl group, a halogeno group, or a hydroxy group; at least one of $R_1$, $R_2$, and $R_3$ is the alkyl group; Ar is a benzene ring, a naphthalene ring, or an anthracene ring; two carbonyl groups are bonded to respective two adjacent carbon atoms of Ar; and X is a linear or branched $C_{1-6}$ alkyl group optionally having a $C_{1-3}$ alkoxy group as a substituent).

The present invention relates to, according to a second aspect, a method for forming a resist pattern, the method comprising steps of: applying the resist underlayer film formation composition for lithography of the present invention onto a semiconductor substrate and baking the composition to form a resist underlayer film having a thickness of 1 nm to 20 mm; forming a resist film on the resist underlayer film; exposing the semiconductor substrate coated with the resist underlayer film and the resist film to radiation selected from the group consisting of a KrF excimer laser, an Arf excimer laser, extreme ultraviolet rays (EUV), and electron beams; and developing the substrate with an alkaline liquid developer after the exposure.

Effects of the Invention

The resist underlayer film formation composition for lithography of the present invention is characterized in that a terminal of a polymer contained in the resist underlayer film formation composition is capped with the structure of Formula (1), and is a composition containing such a polymer, a cross-linking agent, a compound promoting a cross-linking reaction, and an organic solvent. In such a composition, the polymer has higher solubility in the organic solvent. Accordingly, the resist underlayer film formation composition of the present invention has higher coating properties and enables the formation of a resist underlayer film having a uniform film thickness of 20 nm or less without defects.

BRIEF DESCRIPTION OF THE DRAWING

FIG. 1 is a view showing top faces and sections of substrates with patterns, the substrates being used in a coating property test.

MODES FOR CARRYING OUT THE INVENTION

[Polymer]

A polymer contained in the resist underlayer film formation composition for lithography of the present invention has the structure of Formula (1) at terminals of a polymer chain, in Formula (1), at least one of $R_1$, $R_2$, and $R_3$ is a linear or branched $C_{1-13}$ alkyl group. Examples of the alkyl group include tert-butyl group, methyl group, ethyl group, propyl group, isopropyl group, butyl group, sec-butyl group, pentyl group, hexyl group, octyl group, nonyl group, decyl group, undecyl group, and dodecyl group. In the present invention, the tert-butyl group is preferred. In Formula (1), the alkyl group representing, X is exemplified by methyl group, ethyl group, propyl group, isopropyl group, butyl group, sec-butyl group, pentyl group, and hexyl group, and the alkoxy group as the substituent is exemplified by a methoxy group, an ethoxy group, and a propoxy group. When one or two of $R_1$, $R_2$, and $R_3$ in Formula (1) are halogeno groups, the halogeno group is exemplified by a chloro group, a fluoro group, a bromo group, and an iodine group.

The polymer having the structure of Formula (1) at terminals of a polymer chain is a reaction product of material monomers containing a compound of Formula (1a) and a compound of Formula (1b):

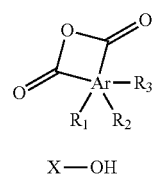

(1a)

X—OH (1b)

(where $R_1$, $R_2$, $R_3$, Ar and X mean the same as those of Formula (1)).

The polymer has structural units of Formula (2) and Formula (3), for example:

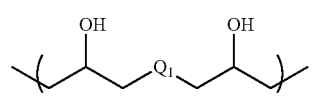

(2)

(3)

(where $Q_1$ and $Q_2$ are each independently a divalent group having a linear or branched $C_{1-13}$ hydrocarbon group, a divalent group having an alicyclic hydrocarbon group, a divalent group having an aromatic ring, or a divalent group having a heterocycle including 1 to 3 nitrogen atoms; and the hydrocarbon group, the alicyclic hydrocarbon group, the aromatic ring, and the heterocycle optionally have at least one substituent).

In this case, the material monomers for obtaining the polymer contain, together with the compound of Formula (1a) and the compound of Formula (1b), a monomer that constitutes the structural unit of Formula (2) and a monomer that constitutes the structural unit of Formula (3).

The structural unit of Formula (2) is represented by Formula (2'), for example:

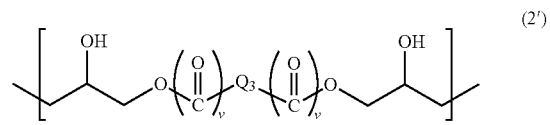

(2')

(where $Q_3$ is a linear or branched $C_{1-13}$ hydrocarbon group, a divalent group having an alicyclic hydrocarbon group, or a divalent group having an aromatic ring; the hydrocarbon group, the alicyclic hydrocarbon group, and the aromatic ring optionally have at least one substituent; and two v are each independently 0 or 1).

For example, $Q_3$ is represented by the following groups.

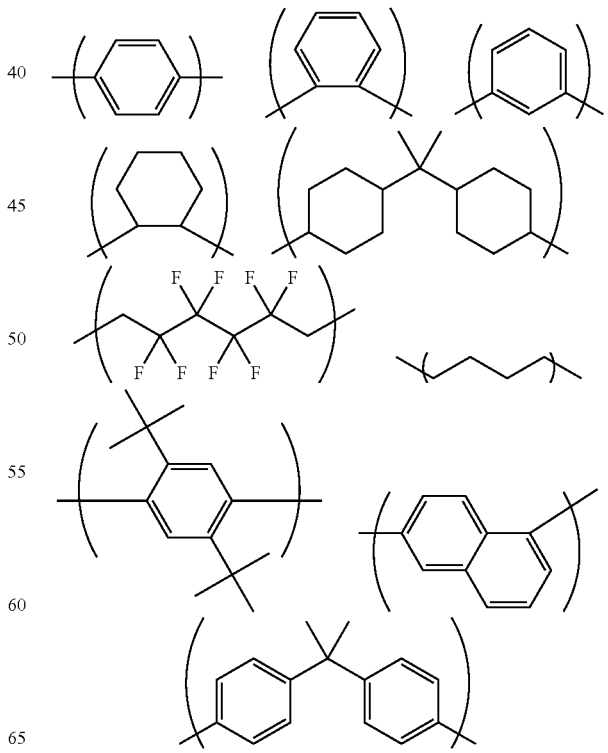

The structural unit of Formula (3) is represented by, for example, Formula (3')

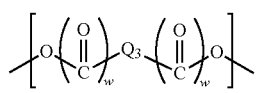 (3')

(where $Q_4$ is a linear or branched $C_{1-13}$ hydrocarbon group, an alicyclic hydrocarbon group, or an aromatic ring; the hydrocarbon group, the alicyclic hydrocarbon group, and the aromatic ring optionally have at lest one substituent; the hydrocarbon group optionally has one or two sulfur atoms and optionally has a double bond in the main chain thereof; and two w are each independently 0 or 1).

For example, $Q_4$ is represented by the following groups.

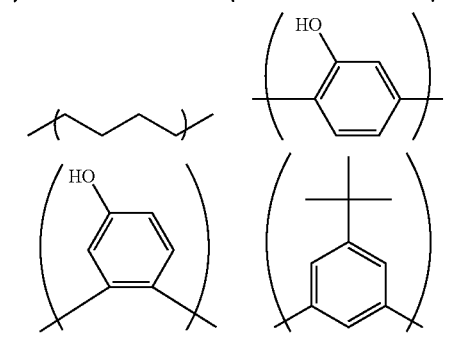

Examples of the substituent for the hydrocarbon group include hydroxy group and fluoro group. Examples of the substituent for the alicyclic hydrocarbon group, the aromatic ring, and the heterocycle include methyl group, ethyl group, tert-butyl group, allyl group, hydroxy group, and fluoro group. Examples of the alicyclic hydrocarbon group include cyclobutylene group, cyclopentylene group, and cyclohexylene group. Examples of the aromatic ring include benzene ring, naphthalene ring, and anthracene ring. Examples of the heterocycle include triazinetrione ring, pyrimidinetrione ring, imidazolidinedione ring, imidazolidone ring, and pyridone ring.

Examples of the compound of Formula (1a) include compounds of

Formula (1-1) to Formula (1-17). Examples of the compound of Formula (1b) include, but are not limited to, propylene glyeol monomethyl ether and 4-methyl-2-pentanol.

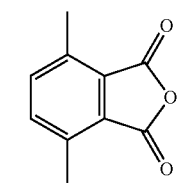 (1-1)

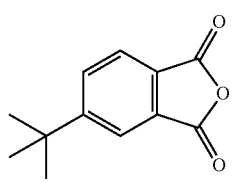 (1-2)

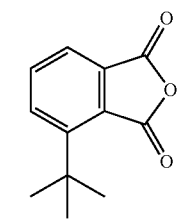 (1-3)

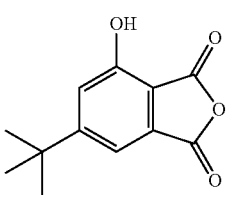 (1-4)

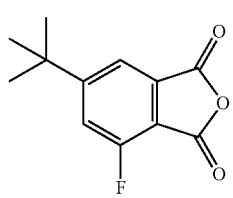 (1-5)

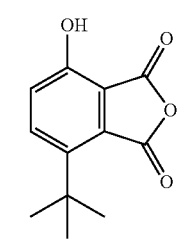 (1-6)

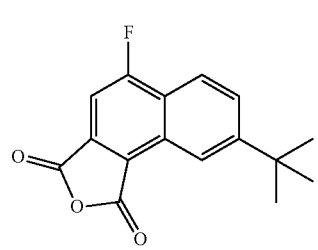 (1-7)

(1-8)
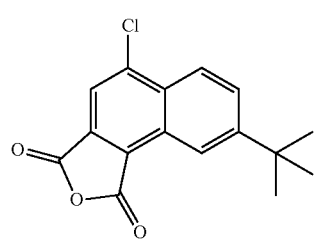
(1-9)
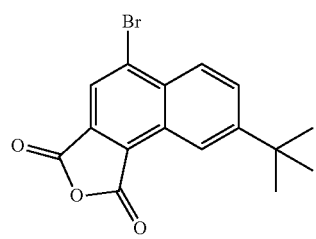
(1-10)
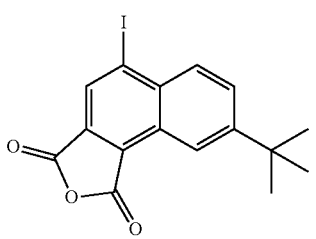
(1-11)
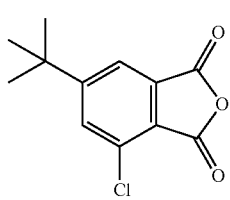
(1-12)
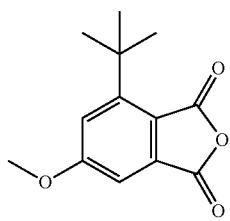
(1-13)
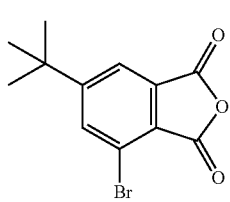
(1-14)
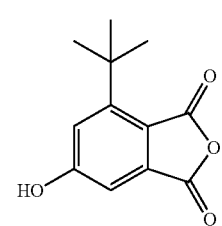
(1-15)
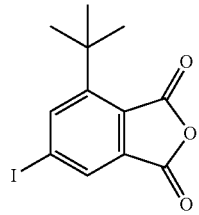
(1-16)
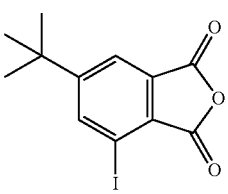
(1-17)
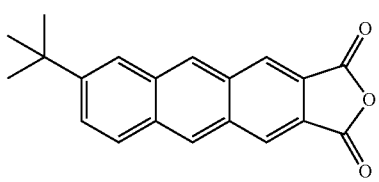
Examples of a monomer forming the structural unit of Formula (2) include compounds each of which has two epoxy groups, of Formulae (2-1) to (2-16):
(2-1)
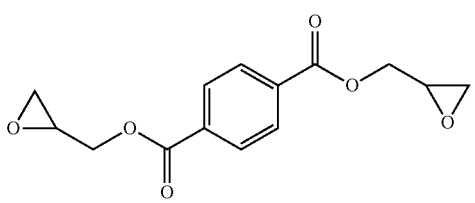
(2-2)
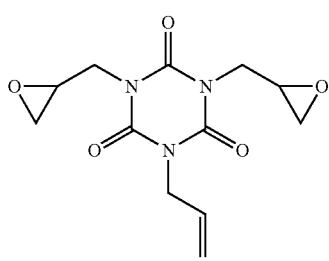
(2-3)
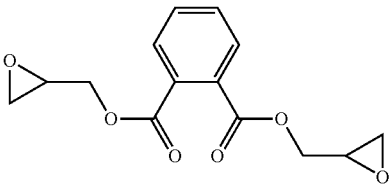
(2-4)
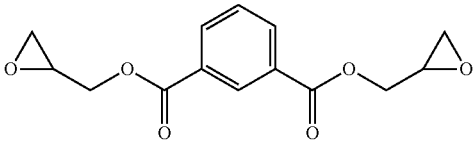

(2-5)
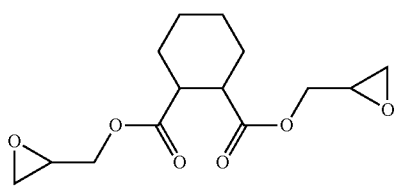
(2-6)
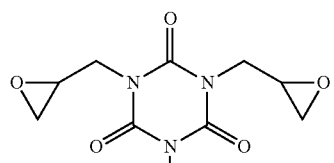
(2-7)
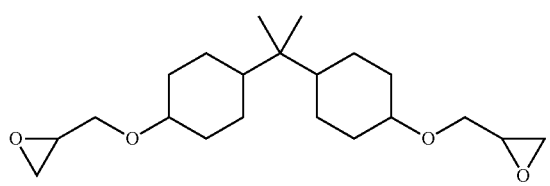
(2-8)
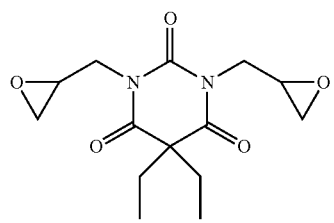
(2-9)
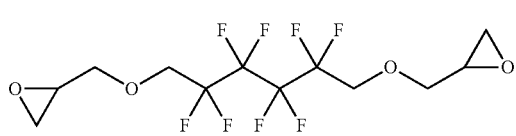
(2-10)
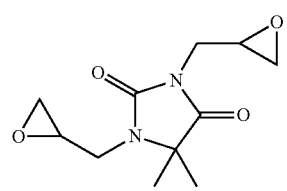
(2-11)
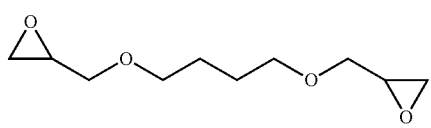
(2-12)
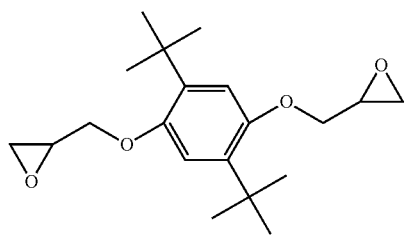
(2-13)
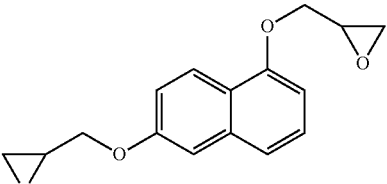
(2-14)
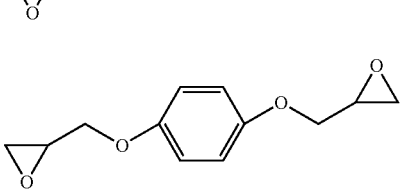
(2-15)
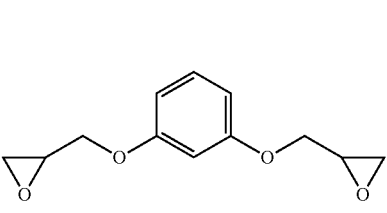
(2-16)
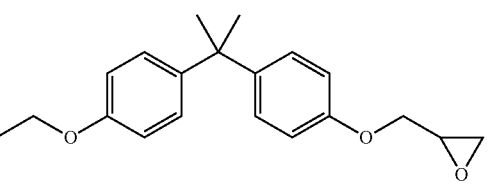
Examples of a monomer forming the structural unit of Formula (3) include compounds of Formulae (3-1) to (3-10):
(3-1)
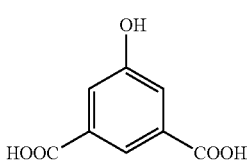
(3-2)
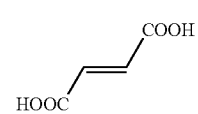
(3-3)
(3-4)
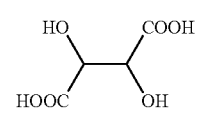
(3-5)
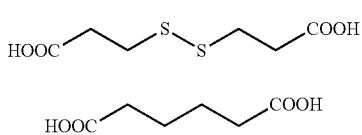
(3-6)
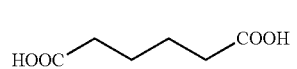

-continued

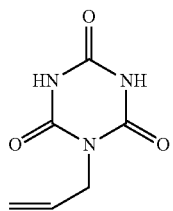
(3-7)

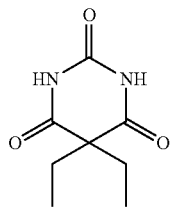
(3-8)

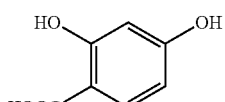
(3-9)

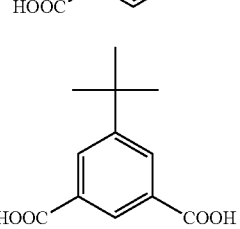
(3-10)

The polymer contained in the resist underlayer film formation composition for lithography of the present invention is represented by Formula (4), for example:

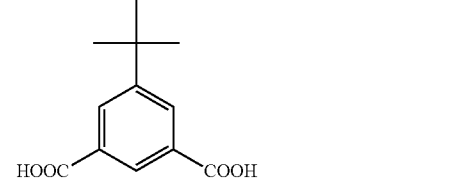
(4)

(where $R_1$, $R_2$, $R_3$, Ar, and X mean the same as those of Formula (1); and Y is a polymer chain having the structural units of Formula (2) and Formula (3)).

Formula (4) represents that the terminals of the polymer chain are capped with the structure of Formula (1).

In the material monomers required for obtaining the polymer of Formula (4), the compound of Formula (1a) and the compound of Formula (1b) are contained in an amount of for example, 1% by mass to 30% by mass (in terms of the charging ratio of the monomers) and preferably 2% by mass to 20% by mass relative to 100% by mass of the total amount of the monomers that constitute the structural units of Formula (2) and Formula (3).

The polymer contained in the resist underlayer film formation composition for lithography of the present invention may be any of a random copolymer, a block copolymer, an alternating copolymer, and a graft copolymer. The polymerization method of the polymer can employ various methods such as solution polymerization, suspension polymerization, emulsion polymerization, and bulk polymerization and may use a polymerization catalyst or the like as needed.

As an example of the polymerization method, the polymer can be synthesized by adding, in an organic solvent, the monomer forming the structure of Formula (1) and a polymerization catalyst into the monomer forming the structural unit of Formula (2) and the monomer forming the structural unit of Formula (3) and performing thermal polymerization. The organic solvent used in this method can be appropriately selected from the preferable examples of the organic solvent, which is described below, contained in the resist underlayer film formation composition for lithography of the present invention. Examples of the polymerization catalyst include benzyltriethylammonium chloride and ethyltriphenylphosphonium bromide. The polymerization can be perfumed by heating at, for example, 50° C. to 160° C. and preferably 70° C. to 130° C. The reaction time is, for example, 1 hour to 50 hours and preferably 2 hours to 12 hours.

The weight-average molecular weight of the polymer is, for example, 1,000 to 100,000 and preferably 1,000 to 10,000. When the value of the weight-average molecular weight is too large, the coating properties of the resist underlayer film formation composition for lithography of the present invention deteriorate. The polymer contained in the resist underlayer film formation composition for lithography of the present invention is, for example, 0.01% by mass to 3% by mass and preferably 0.1% by mass to 2% by mass per 100% by mass of the composition.

[Cross-Linking Agent]

The resist underlayer film formation composition for lithography of the present invention further includes a cross-linking agent. The cross-linking agent is not particularly limited but is preferably a nitrogen-containing compound having at least two cross-linking substituents (methylol groups, methoxymethyl groups, and butoxymethyl groups, for example).

Examples of the cross-linking agent include hexamethoxymethylmelamine, tetramethoxymethylbenzoguanamine, 1,3,4,6-tetrakis(methoxymethy)glycoluril, 1,3,4,6-tetrakis(butoxymethyl)glycoluril, 1,3,4,6-tetrakis(hydroxymethyl)glycoluril, 1,3-bis(hydroxymethyl)urea, 1,1,3,3-tetrakis(butoxymethyl)urea, and 1,1,3,3-tetrakis(methoxymethyl)urea. The cross-linking agent contained in the resist underlayer film formation composition for lithography of the present invention is, for example, 1% by mass to 100% by mass and preferably 10% by mass to 50% by mass per 100% by mass of the polymer in the composition. These cross-linking agents may cause a crosslinking reaction through self-condensation but can cause a crosslinking reaction with the polymer, in particular, the cross-linkable functional groups (hydroxy groups) in the structural units of Formulae (2) and (3) that are structural units that react with cross-linking agents to form cross-links.

[Compound Promoting Cross-Linking Reaction]

The resist underlayer film formation composition for lithography of the present invention further includes a compound promoting a cross-linking reaction in order to promote a cross-linking reaction. Examples of such a compound available include sulfonic acid compounds and carboxylic acid compounds such as p-toluenesulfonic acid, trifluoromethanesulfonic acid, pyridinium p-toluenesulfonate, salicylic acid, camphor sulfonic acid, 5-sulfosalicylic acid, 4-chlorobenzenesulfonic acid, 4-hydroxybenzenesulfonic acid, benzenedisulfonic acid, 1-naphthalenesulfonic acid, citric acid, benzoic acid, and hydroxybenzoic acid. These compounds promoting a cross-linking reaction can be used singly or in combination of two or more of them. The compound promoting the cross-linking reaction contained in the resist underlayer film formation composition for lithography of the present invention is, for example, 0.1% by mass to 25% by mass and preferably 1% by mass to 10% by mass per 100% by mass of the polymer in the composition.

[Organic Solvent]

The resist underlayer film formation composition for lithography of the present invention further includes an organic solvent. The organic solvent to be used in the present invention is not particularly limited so long as the solvent can dissolve the polymer described above. Examples of the organic solvent available include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monopropyl ether, 1-ethoxy-2-propanol, propylene glycol monomethyl ether acetate, propylene glycol propyl ether acetate, 1-methoxy-2-butanol, 2-methoxy-1-butanol, 3-methoxy-3-methylbutanol, 3-methoxy-1-butanol, toluene, xylene, methyl ethyl ketone, cyclopentanone, cyclohexanone, γ-butyrolactone. N-methyl-2-pyrrolidone, methyl 2-hydroxyisobutyrate, ethyl 2-hydroxypropionate, ethyl 2-hydroxy-2-methylpropionate, ethyl ethoxyacetnte, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate. These organic solvents can be used singly or in combination of two or more of them.

Among the organic solvents, propylene glycol monomethyl ether, propylene glycol monomethyl ether acetate, 1-ethoxy-2-propanol, ethyl lactate, butyl lactate, and cyclohexanone are preferred. The organic solvent contained, in the resist underlayer film formation composition for lithography of the present invention is in an amount of, for example, 90% by mass to 99.99% by mass and preferably 98% by mass to 99.9% by mass relative to 100% by mass of the composition. In the present specification, components of the resist underlayer film formation composition except the organic solvents are expressed as solid contents.

[Acid Generator]

The resist underlayer film formation composition for lithography of the present invention may further include an acid generator. Examples of such an acid generator include bis(4-hydroxyphenyl) sulfone. When the resist underlayer film formation composition for lithography of the present invention includes the acid generator, the acid generator is, for example, 0.1% by mass to 5% by mass and preferably 0.2% by mass to 3% by mass per 100% by mass of the polymer in the composition.

[Other Additives]

The resist underlayer film formation composition for lithography of the present invention may further include various additives such as surfactants as necessary unless the additives impair the effects of the present invention. The surfactants are additives to improve the coating properties of the composition on a substrate. Known surfactants such as nonionic surfactants and fluorine-based surfactants are available.

Specific examples of the surfactants include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkyl aryl ethers such as polyoxyethylene octyl phenyl ether and polyoxyethylene nonylphenyl ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorine-based surfactants such as EFTOP [registered trademark] EF301, EF303, and EF352 [manufactured by Mitsubishi Materials Electronic Chemicals Co., Ltd.], MEGAFACE [registered trademark] F171, F173, and R30 (manufactured by DIC Corporation), FLUORAD FC430 and FC431 (manufactured by Sumitomo 3M Limited), and ASAHIGUARD [registered trademark] AG710 and SURFLON [registered trademark] S-382, SC101, SC102, SC103, SC104, SC105, and SC106 (manufactured by Asahi Glass Co., Ltd.), and organosiloxane polymer KP341 (manufactured by Shin-Etsu Chemical Co., Ltd.). These surfactants may be added singly or in combination of two or more of them.

When the resist underlayer film formation composition for lithography of the present invention includes such a surfactant, the surfactant is, for example, 0.1% by mass to 5% by mass and preferably 0.2% by mass to 3% by mass per 100% by mass of the polymer in the composition.

The method for forming a resist pattern of the present invention will be explained. First, the resist underlayer film formation composition for lithography of the present invention is applied with an appropriate applying methods such as a spinner and a coater onto a substrate used in production of a precision integrated circuit device [a semiconductor substrate such as a silicon wafer coated with a silicon oxide film, a silicon nitride film, or a silicon oxynitride film, a silicon nitride substrate, a quartz substrate, a glass substrate (including alkali-free glass, low alkali glass, and crystallized glass), and a glass substrate having an ITO film formed thereon, for example], and thereafter, the applied composition is baked with a heating means such as a hot plate and is cured to produce a resist underlayer film.

The conditions for the baking after the application is selected as appropriate from the ranges of, for example, a baking temperature of 80° C. to 250° C. and a baking time of 0.3 minutes to 60 minutes and preferably 150° C. to 250° C. and 0.5 minutes to 5 minutes. Baking in such a condition causes a reaction between a cross-linking moiety such as a hydroxy group in the structural unit of the polymer and a cross-linking agent to form a cross-linked structure. Particularly, by cross-linking the polymer contained in the resist underlayer film formation composition for lithography of the present invention, the cross-linked polymer with a high cross-linking density can be obtained. The film thickness of the resist underlayer film is, for example, 0.001 μm (1 nm) to 0.1 μm, preferably 0.001 μm to 0.02 μm (20 nm), and further preferably 0.003 μm to 0.01 μm.

Next, a resist film is formed on the produced resist underlayer film. The resist film can be formed by a typical method, that is, by applying a resist solution onto the resist underlayer film and baking the resultant film. The resist solution to be applied is not particularly limited so long as the solution is photosensitive to for example, a KrF excimer laser, an ArF excimer laser, EUV, and electron beams, and both negative type and positive type can be used. Examples of the resist solution available include trade names PAR710 and PAR855 manufactured by Sumitomo Chemical Company, Limited, trade name AR2772JN manufactured by JSR Corporation, trade name SEPR430 manufactured by Shin- Etsu Chemical Co., Ltd., and trade name APEX-X manufactured by The Dow Chemical Company (formerly Rohm and Haas Electronic Materials Company).

Subsequently, the resist film formed on the top layer of the resist underlayer film is exposed through a predetermined mask (reticle). For example, a KrF excimer laser, an ArF excimer laser, and EUV are available in the exposure. However, a mask (reticle) is not required for exposure with electron beams. After the exposure, post exposure hake (PEB) may also be performed as needed. The conditions for the post exposure bake are selected as appropriate from the ranges of a baking temperature of 80° C. to 150° C. and a baking time of 0.3 minutes to 60 minutes.

After the exposure, the resultant film is developed, rinsed, and dried to produce a favorable resist pattern. Examples of a liquid developer for the resist film include aqueous solutions of alkalis, for example, aqueous solutions of inorganic alkalis such as sodium hydroxide, potassium hydroxide, sodium carbonate, sodium silicate, sodium metasilicate, and ammonia water, aqueous solutions of primary amines such as ethylamine and n-propylamine, aqueous solutions of secondary amines such as diethylamine and di-n-butylamine, aqueous solutions of tertiary amines such as triethylamine and methyldiethylamine, aqueous solutions of alcohol amines such as dimethylethanolamine and triethanolamine, aqueous solutions of quaternary ammonium salts such as tetramethylammonium hydroxide, tetraethylammonium hydroxide, and choline, and aqueous solutions of cyclic amines such as pyrrole and piperidine. Furthermore, the aqueous solutions of alkalis can also be used by being added with, for example, alcohols such as isopropyl alcohol and surfactants such as nonionic surfactants in an adequate amount. Among these, preferable liquid developers are the aqueous solutions of quaternary ammonium salts, and the aqueous solution of tetramethylammonium hydroxide is further preferable. The conditions for the development are selected as appropriate from the ranges of a developing temperature of 5° C. to 50° C. and a developing time of 10 seconds to 300 seconds.

The exposed portion of the resist tmderlayer film from which the resist film is removed by the development in the process described above is removed by dry etching, and a desired pattern can be formed on the substrate.

EXAMPLES

The present invention will be specifically desaibed in synthesis examples and examples but is not limited to the descriptions.

In the present specification, the weight-average molecular weights shown in Synthesis Example 1 to Synthesis Example 7 are the measurement results determined by gel permeation chromatography (abbreviated as GPC in the present specification hereinafter). The measurement was performed with a GPC apparatus manufactured by Tosoh Corporation in the following measurement conditions. The degrees of distribution shown in the synthesis examples in the present specification are calculated from measured weight-average molecular weights and number-average molecular weights.

GPC column: Shodex [registered trademark], Asahipak [registered trademark] (SHOWA DENKO K.K.)
Column temperature: 40° C.
Solvent: N,N-dimethylformamide (DMF)
Flow rate: 0.6 mL/min
Standard sample: polystyrene (manufactured by Tosoh Corporation)
Detector: RI detector (manufactured by Tosoh Corporation. RI-8020)

<Synthesis Example 1>

Into 35.58 g of propylene glycol monomethyl ether, 5.00 g of diglycidyl terephthalate (manufactured by Nagase ChemteX Corporation, trade name: Denacol [registered trademark] EX711), 3.17 g at 5-hydroxyisophthalic acid (manufactured by Tokyo Chemical Industry Co., Ltd.), 0.53 g of 4-tert-butylphthalic anhydride (manufactured by Tokyo Chemical Industry Co., Ltd.), and 0.20 g of benzyltriethylammonium chloride (manufactured by Tokyo Chemical Industry Co., Ltd.) were added and dissolved. The reaction container was purged with nitrogen, and the mixture was reacted at 135° C. for 4 hours to obtain a polymer solution. The polymer solution did not cause cloudiness or the like even when cooled to room temperature, and the polymer had good solubility in propylene glycol monoinethyl ether. GPC analysis revealed that the polymer in the obtained solution had a weight-average molecular weight of 5,029 in terms of standard polystyrene and had a degree of distribution of 3.04. The polymer obtained in the synthesis example has the structural units of Formula (5) and Formula (6) and also has the structure of Formula (7) at the terminals.

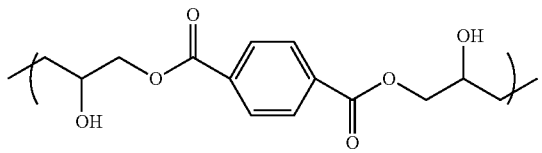

(5)

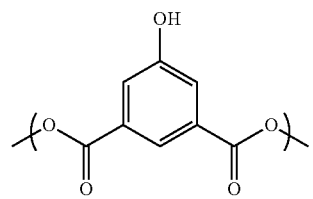

(6)

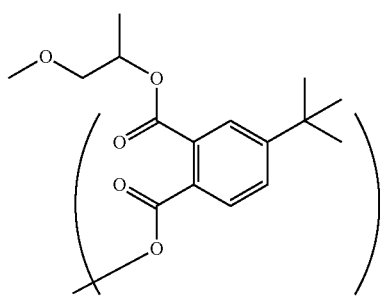

(7)

<Synthesis Example 2>

Into 36.30 g of propylene glycol monomethyl ether, 5.00 g of diglycidyl terephthalate (manufactured by Nagase ChemteX Corporation, trade name: Denacol [registered trademark] EX711), 3.17 g of 5-hydroxyisophthalic acid (manufactured by Tokyo Chemical industry Co., Ltd.), 0.71 g of 4-tert-butylphthalic anhydride (manufactured by Tokyo Chemical Industry Co., Ltd.). and 0.20 g of benzyltriethylammonium chloride (manufactured by Tokyo Chemical Industry Co., Ltd.) were added and dissolved, The reaction container was purged with nitrogen, and the mixture was reacted at 135° C. for 4 hours to obtain a polymer solution. The polymer solution did not cause cloudiness or the like even when cooled to room temperature, and the polymer had good solubility in propylene glycol monomethyl ether. GPC analysis revealed that the polymer in the obtained solution had a weight-average molecular weight of 1,639 in terms of standard polystyrene and had a degree of distribution of 2.67. As with the polymer obtained in Synthesis Example 1, the polymer obtained in the synthesis example has the structural units of Formula (5) and Formula (6) and also has the structure of Formula (7) at the terminals.

<Synthesis Example 3>

Into 36.65 g of propylene glycol monomethyl ether, 5.00 g of diglycidyl terephthalate (manufactured by Nagase ChemteX Corporation, trade name: Denacol [registered trademark] EX711), 3.17 g of 5-hydroxyisophthalic acid (manufactured by Tokyo Chemical Industry Co., Ltd.), 0.80 g of 4-tert-butylphthalic anhydride (manufactured by Tokyo Chemical industry Co., Ltd.), and 0.20 g of benzyltriethylammonium chloride (manufactured by Tokyo Chemical Industry Co., Ltd.) were added and dissolved. The reaction container was purged with nitrogen, and the mixture was reacted at 135° C. for 4 hours to obtain a polymer solution. The polymer solution did not cause cloudiness or the like even when cooled to room temperature, and the polymer had good solubility in propylene glycol monomethyl ether. GPC analysis revealed that the polymer in the obtained solution had a weight-average molecular weight of 4,366 in terms of standard polystyrene and had a degree of distribution of 2.29. As with the polymer obtained in Synthesis Example 1, the polymer obtained in the synthesis example has the structural units of Formula (5) and Formula (6) and also has the structure of Formula (7) at the terminals.

<Synthesis Example 4>

Into 34.70 g of propylene glycol monomethyl ether, 5.00 g of diglycidyl terephthalate (manufactured by Nagase ChemteX Corporation, trade name: Denacol [registered trademark] EX711), 2.68 g of 2,4-dihydroxybenzoic acid (manufactured by Tokyo Chemical Industry Co., Ltd.), 0.80 g of 4-tert-butylphthalic anhydride (manufactured by Tokyo Chemical industry Co., Ltd.), and 0.20 g of benzyltriethylammonium chloride (manufactured by Tokyo Chemical Industry Co., Ltd.) were added and dissolved. The reaction container was purged with nitrogen, and the mixture was reacted at 135° C. for 4 hours to obtain a polymer solution. The polymer solution did not cause cloudiness or the like even when cooled to room temperature, and the polymer had good solubility in propylene glycol monomethyl ether. GPC analysis revealed that the polymer in the obtained solution had a weight-average molecular weight of 1,671 in terms of standard polystyrene and had a degree of distribution of 1.78. The polymer obtained in the synthesis example has the structural units of Formula (5) and Formula (8) and also has the structure of Formula (7) at the terminals.

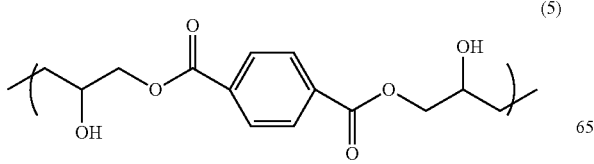

(5)

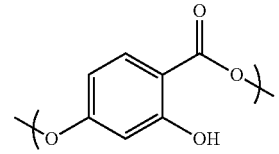

(8)

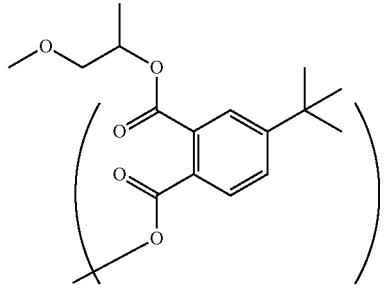

(7)

<Synthesis Example 5>

Into 37.18 g of propylene glycol monomethyl ether, 5.00 g of monoallyldiglycidyl isocyanuric acid (manufactured by Shikoku Chemicals Corporation), 3.27 g of 5-hydroxyisophthalic acid (manufactured by Tokyo Chemical Industry Co., Ltd.), 0.82 g of 4-tert-butylphthalic anhydride (manufactured by Tokyo Chemical Industry Co., Ltd.), and 0.20 g of benzyltriethylammonium chloride (manufactured by Tokyo Chemical Industry Co., Ltd.) were added and dissolved. The reaction container was purged with nitrogen, and the mixture was reacted at 135° C. for 4 hours to obtain a polymer solution. The polymer solution did not cause cloudiness or the like even when cooled to room temperature, and the polymer had good solubility in propylene glycol monomethyl ether, GPC analysis revealed that the polymer in the obtained solution had a weight-average molecular weight of 4,319 in terms of standard polystyrene and had a degree of distribution of 1.92. The polymer obtained in the synthesis example has the structural units of Formula (9) and Formula (6) and also has the structure of Formula (7) at the terminals.

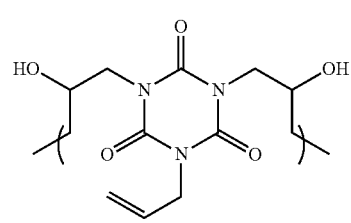

(9)

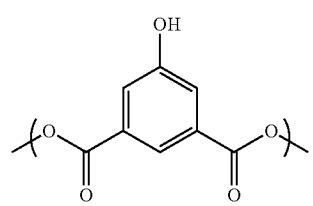

(6)

-continued (7)

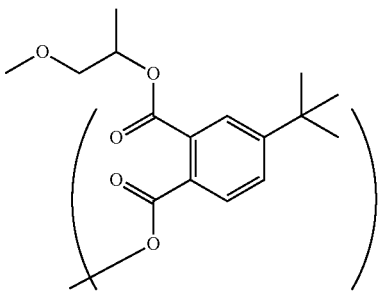

<Synthesis Example 6>

Into 35.17 g of propylene glycol monomethyl ether, 5.00 g of monoallyldiglycidyl isocyanuric acid (manufactured by Shikoku Chemicals Corporation), 2.76 g of 2,4-dihydroxybenzoic acid (manufactured by Tokyo Chemical Industry Co., Ltd.), 0.82 g of 4-tert-butylphthalic anhydride (manufactured by Tokyo Chemical Industry Co., Ltd.), and 0.20 g of benzyltriethylammonium chloride (manufactured by Tokyo Chemical Industry Co., Ltd.) were added and dissolved. The reaction container was purged with nitrogen, and the mixture was reacted at 135° C. for 4 hours to obtain a polymer solution. The polymer solution did not cause cloudiness or the like even when cooled to room temperature, and the polymer had good solubility in propylene glycol monomethyl ether. GPC analysis revealed that the polymer in the obtained solution had a weight-average molecular weight of 1,726 in terms of standard polystyrene and had a degree of distribution of 1.69. The polymer obtained in the synthesis example has the structural units of Formula (9) and Formula (8) and also has the structure of Formula (7) at the terminals.

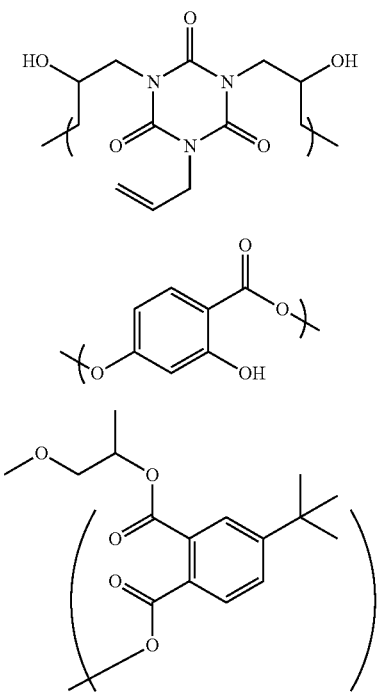

<Synthesis Example 7>

Into 35.60 g of propylene glycol monomethyl ether, 5.00 g of diglycidyl terephthalate (manufactured by Nagase ChemteX Corporation, trade name: Denacel [registered trademark] EX711), 3.15 g of 5-hydroxyisophthalic acid (manufactured by Tokyo Chemical Industry Co., Ltd.), and 0.20 g of benzyltriethylammonium chloride (manufactured by Tokyo Chemical Industry Co., Ltd.) were added and dissolved. The reaction container was purged with nitrogen, and the mixture was reacted at 135° C. for 4 hours to obtain a polymer solution. The polymer solution did not cause cloudiness or the like even when cooled to room temperature., and the polymer had good solubility in propylene glycol monomethyl ether. GPC analysis revealed that the polymer in the obtained solution had a weight-average molecular weight of 15,673 in terms of standard polystyrene and had a degree of distribution of 3.39. The polymer obtained in the synthesis example has the structural units of Formula (5) and Formula (6), but the polymer does not have the structure of Formula (7) at the terminals.

(5)

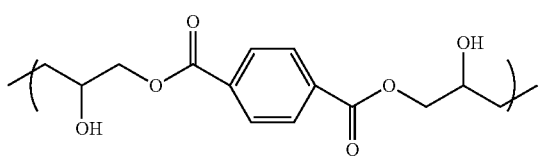

(6)

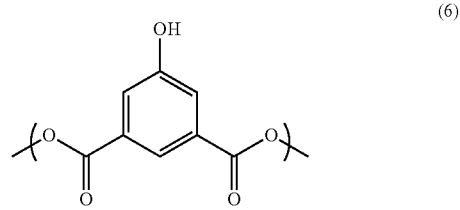

[Solubility Evaluation of Polymer in PGMEA]

When the obtained polymer is used to prepare a resist underlayer film formation composition for lithography, a higher solubility of the polymer in the organic solvent to be used improves the coating properties of the composition. Hence, the solubility in propylene glycol monomethyl ether acetate abbreviated as PGMEA was evaluated by the absorbance measured with an ultraviolet-visible spectrophotometer, UV-2550 (manufactured by Shimadzu Corporation). A lower absorbance to be determined indicates that a polymer has a higher solubility. As a reference sample, a mixed solvent of propylene glycol monomethyl ether acetate/propylene glycol monomethyl ether (97/3 in terms of % by mass) was used.

Each of the polymer solutions obtained in Synthesis Example 1 to Synthesis Example 7 was adjusted such that a solution of propylene glycol monomethyl ether acetate/propylene glycol monomethyl ether (97/3 in terms of % by mass) having a solid content concentration of 0.5% by mass was obtained. Each of the prepared polymer solutions was placed in a 1-cm square quartz cell, and the absorbance was measured at a wavelength of 550 nm. Table 1 shows the measurement results. The polymers obtained in Synthesis Example 2 to Synthesis Example 6 showed good solubility in propylene glycol monomethyl ether acetate.

TABLE 1

| | Synthesis Example 1 | Synthesis Example 2 | Synthesis Example 3 | Synthesis Example 4 | Synthesis Example 5 | Synthesis Example 6 | Synthesis Example 7 |
|---|---|---|---|---|---|---|---|
| Absorbance at 550 nm | 0.066 | 0.003 | 0.002 | 0.006 | −0.002 | −0.001 | 2.151 |

<Example 1>

In 1.75 g of the polymer solution containing 0.31 g of the polymer obtained in Synthesis Example 3, 0.078 g of tetramethoxymethylglycoluril (manufactured by Nihon Cytec Industries Inc. [formerly Mitsui Cytec, Ltd.], trade name: POWDERLINK [registered trademark] 1174) and 0.0078 g of 5-sulfosalicylic acid (manufactured by Tokyo Chemical Industry Co., Ltd.) were mixed, and 10.36 g of propylene glycol monomethyl ether and 27.72 g of propylene glycol monomethyl ether acetate were added and dissolved. The resulting solution was then filtered through a polyethylene microfilter having a pore size of 0.05 µm to obtain a resist underlayer film formation composition for lithography.

<Example 2>

In 1.40 g of the polymer solution containing 0.24 g of the polymer obtained in Synthesis Example 4, 0.059 g of tetramethoxymethylglycoluril (manufactured by Nihon Cytec Industries Inc. [formerly Mitsui Cytec, Ltd.], trade name: POWDERLINK [registered trademark] 1174) and 0.0059 g of pyridinium p-toluenesulfonate (manufactured by Tokyo Chemical Industry Co., Ltd.) were mixed, and 7.75 g of propylene glycol monomethyl ether and 20.79 g of propylene glycol monomethyl ether acetate were added and dissolved. The resulting solution was then filtered through a polyethylene microfilter having a pore size of 0.05 µm to obtain a resist underlayer film formation composition for lithography.

<Example 3>

In 1.35 g of the polymer solution containing 0.24 g of the polymer obtained in Synthesis Example 5, 0.059 g of tetramethoxymethylglycoluril (manufactured by Nihon Cytec Industries Inc. [formerly Mitsui Cytec, Ltd.], trade name: POWDERLINK [registered trademark] 1174) and 0.0059 g of pyridinium p-toluenesulfonate (manufactured by Tokyo Chemical Industry Co., Ltd.) were mixed, and 7.74 g of propylene glycol monomethyl ether and 20.79 g of propylene glycol monomethyl ether acetate were added and dissolved. The resulting solution was then filtered through a polyethylene microfilter having a pore size of 0.05 µm to obtain a resist underlayer film formation composition for lithography.

<Example 4>

In 1.29 g of the polymer solution containing 0.24 g of the polymer obtained in Synthesis Example 6, 0.059 g of tetramethoxymethylglycoluril (manufactured by Nihon Cytec Industries Inc. [formerly Mitsui Cytec. Ltd.], trade name: POWDERLINK [registered trademark] 1174) and 0.0059 g of pyridinium p-toluenesulfonate (manufactured by Tokyo Chemical Industry Co., Ltd,) were mixed, and 7.80 g of propylene glycol monomethyl ether and 20.79 g of propylene glycol monomethyl ether acetate were added and dissolved. The resulting solution was then filtered through a polyethylene microfilter having a pore size of 0.05 µm to obtain a resist underlayer film formation composition for lithography.

<Comparative Example 1>

In 1.31 g of the polymer solution containing 0.23 g of the polymer obtained in Synthesis Example 7, 0.059 g of tetramethoxymethylglycoluril (manufactured by Nihon Cytec Industries Inc. [formerly Mitsui Cytec, Ltd.], trade name: POWDERLINK [registered trademark] 1174) and 0.0058 g or 5-sulfosalicylie acid were mixed, and 21.27 g of propylene glycol monomethyl ether and 8.91 g of propylene glycol monomethyl ether acetate were added and dissolved. The resulting solution was then filtered through a polyethylene microfilter having a pore size of 0.05 µm to obtain a resist underlayer film formation composition for lithography.

<Comparative Example 2>

A resist underlayer film formation composition was prepared which contained a copolymer of Formula (10) as a polymer and further contained, as additives, a crosslinking agent of Formula (11) and pyridinium p-toluenesulfonate.

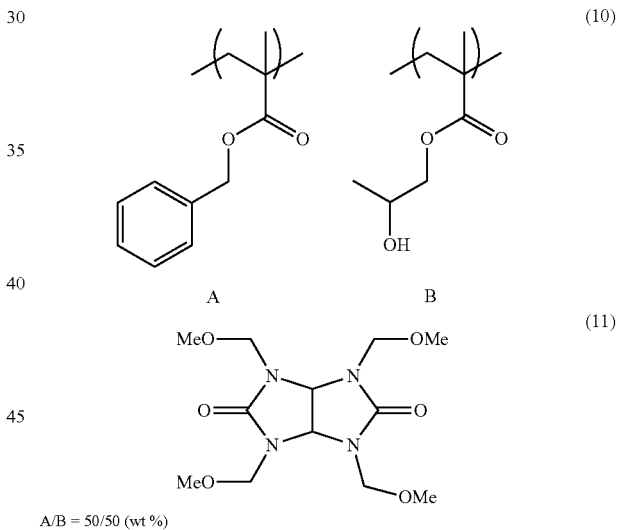

(Elution Test in Photoresist Solvent)

The resist underlayer film formation compositions prepared in Examples 1 to 4 and Comparative Examples 1 and 2 were each applied onto respective silicon wafers serving as semiconductor substrates with a spinner. The resultant silicon wafers were placed on a hot plate and were baked at 205° C. for 1 minute to form resist underlayer films (each having a film thickness of 0.05 µm). These resist underlayer films were immersed into ethyl lactate and propylene glycol monomethyl ether that are solvents to be used in a photoresist, which verified that the films were insoluble in these solvents.

(Measurement of Dry Etching Rate)

The resist underlayer film formation compositions prepared in Examples 1 to 4 and Comparative Examples 1 and 2 were each applied onto respective silicon wafers with a spinner. The resultant silicon wafers were placed on a hot plate and were baked at 205° C. for 1 minute to form resist underlayer films (each having a film thickness of 0.10 μm). The dry etching rates of them were measured with RIE system ES401 manufactured by Nippon Scientific Co., Ltd.

In a similar manner, a resist solution (PAR855, manufactured by Sumitomo Chemical Co., Ltd.) was applied onto a silicon wafer with a spinner to form a resist film. The dry etching rate thereof was measured with RIE system ES401 manufactured by Nippon Scientific Co., Ltd. The measured dry etching rate was compared with the dry etching rates of the resist underlayer films obtained from the resist underlayer film formation compositions prepared in Examples 1 to 4 and Comparative Examples 1 and 2. Table 2 shows the result.

In Table 2, the selection ratio (resist underlayer film/resist film) of the dry etching rate of the resist underlayer film obtained from each of the resist underlayer film formation compositions of Examples 1 to 4, Comparative Example 1, and Comparative Example 2 with respect to that of the resist film was measured by using a $CF_4$ gas as the etching gas. The resist underlayer films obtained from the resist underlayer film formation compositions of Examples 1 to 4 had larger selection ratios of the dry etching rate than that of the resist underlayer film obtained from the resist underlayer film formation composition of Comparative Example 2.

TABLE 2

|  | Selection ratio of dry etching rate |
| --- | --- |
| Example 1 | 1.4 |
| Example 2 | 1.4 |
| Example 3 | 1.6 |
| Example 4 | 1.5 |
| Comparative Example 1 | 1.4 |
| Comparative Example 2 | 1.1 |

[Coating property test in thin film]

Each of the resist underlayer film formation compositions prepared in Examples 1 to 4 and Comparative Example 1 was applied onto silicon wafer substrates with a film thickness of 5 nm. The silicon wafer substrates had structures with top faces and sections shown in FIG. 1, where one group of the substrates had a square pattern with a length of 13 μm, a width of 13 μm, and a height of 230 nm, and the other group of the substrates had a cross pattern with a length of 14 μm, a width of 14 μm, and a height of 230 nm. The coating properties were observed under an optical microscope (manufactured by Olympus Corporation, MX61L) under dark field conditions. Good coating properties were observed only when the resist underlayer film formation compositions of Examples 1 to 4 were applied.

The invention claimed is:

1. A resist underlayer film formation composition for lithography comprising:

a polymer having a structure of Formula (1) at a terminal of a polymer chain;

a cross-linking agent;

a compound promoting a cross-linking reaction; and an organic solvent:

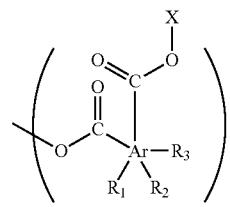

(where $R_1$, $R_2$, and $R_3$ are each independently a hydrogen atom, a linear or branched $C_{1-13}$ alkyl group, a halogeno group, or a hydroxy group; at least one of $R_1$, $R_2$, and $R_3$ is the alkyl group; Ar is a benzene ring, a naphthalene ring, or an anthracene ring; two carbonyl groups are bonded to respective two adjacent carbon atoms of Ar; and X is a linear or branched $C_{1-6}$ alkyl group optionally having a $C_{1-3}$ alkoxy group as a substituent).

2. The resist underlayer film formation composition for lithography according to claim 1, wherein the polymer is a reaction product of material monomers containing a compound of Formula (1a) and a compound of Formula (1b):

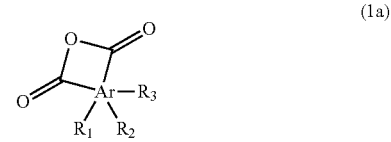

(where $R_1$, $R_2$, $R_3$, Ar, and X mean the same as those of Formula (1)).

3. The resist underlayer film formation composition for lithography according to claim 1, wherein the polymer has structural units of Formula (2) and Formula (3):

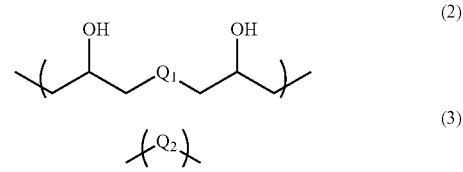

(where $Q_1$ and $Q_2$ are each independently a divalent group having a linear or branched $C_{1-13}$ hydrocarbon group, a divalent group having an alicyclic hydrocarbon group, a divalent group having an aromatic ring, or a divalent group having a heterocycle including 1 to 3 nitrogen atoms; and the hydrocarbon group, the alicyclic hydrocarbon group, the aromatic ring, and the heterocycle optionally have at least one substituent).

4. The resist underlayer film formation composition for lithography according to claim 3, wherein the structural unit of Formula (2) is represented by Formula (2'):

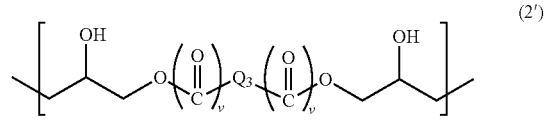

(where $Q_3$ is a linear or branched $C_{1-13}$ hydrocarbon group, a divalent group having an alicyclic hydrocarbon group, or a divalent group having an aromatic ring; the hydrocarbon group, the alicyclic hydrocarbon group, and the aromatic ring optionally have at least one substituent; and two v are each independently 0 or 1).

5. The resist underlayer film formation composition for lithography according to claim 3, wherein the structural unit of Formula (3) is represented by Formula (3'):

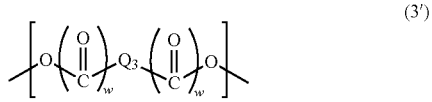

(3')

(where $Q_4$ is a linear or branched $C_{1-13}$ hydrocarbon group, an alicyclic hydrocarbon group, or an aromatic ring; the hydrocarbon group, the alicyclic hydrocarbon group, and the aromatic ring optionally have at least one substituent; the hydrocarbon group optionally has one or two sulfur atoms and optionally has a double bond in a main chain of the hydrocarbon group; and two w are each independently 0 or 1).

6. The resist underlayer film formation composition for lithography according to claim 3, wherein the polymer is represented by Formula (4):

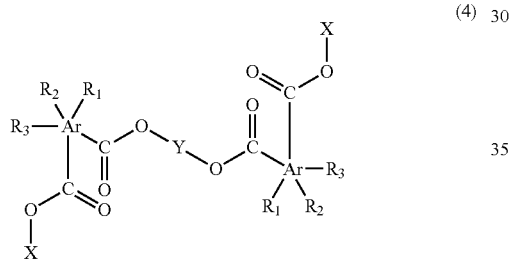

(4)

(where $R_1$, $R_2$, $R_3$, Ar, and X mean the same as those of Formula (1); and Y is a polymer chain having the structural units of Formula (2) and Formula (3)).

7. The resist underlayer film formation composition for lithography according to claim 1, wherein the polymer has a weight-average molecular weight of 1,000 to 100,000.

8. The resist underlayer film formation composition for lithography according to claim 1, wherein the organic solvent is one solvent or a combination of two or more solvents selected from the group consisting of propylene glycol monomethyl ether, propylene glycol monomethyl ether acetate, 1-ethoxy-2-propanol, ethyl lactate, butyl lactate, and cyclohexanone.

9. The resist underlayer film formation composition for lithography according to claim 1, further comprising an acid generator.

10. A method for forming a resist pattern, the method comprising steps of:
applying the resist underlayer film formation composition for lithography as claimed in claim 1 onto a semiconductor substrate and baking the composition to form a resist underlayer film having a thickness of 1 nm to 20 nm;
forming a resist film on the resist underlayer film;
exposing the semiconductor substrate coated with the resist underlayer film and the resist film to radiation selected from the group consisting of a KrF excimer laser, an ArF excimer laser, extreme-ultraviolet rays, and electron beams; and
developing the substrate with an alkaline liquid developer after the exposure.

* * * * *